(12) United States Patent
Stehle

(10) Patent No.: US 7,763,394 B2
(45) Date of Patent: Jul. 27, 2010

(54) PROTECTED PATTERN MASK FOR REFLECTION LITHOGRAPHY IN THE EXTREME UV OR SOFT X-RAY RANGE

(75) Inventor: Jean-Louis Stehle, Colombes (FR)

(73) Assignee: Societe de Production et de Recherches Appliquees Sopra, Colombes (FR)

( * ) Notice: Subject to any disclaimer, the term of this patent is extended or adjusted under 35 U.S.C. 154(b) by 443 days.

(21) Appl. No.: 10/587,194

(22) PCT Filed: Jan. 26, 2005

(86) PCT No.: PCT/FR2005/000168

§ 371 (c)(1),
(2), (4) Date: Jul. 24, 2006

(87) PCT Pub. No.: WO2005/083516

PCT Pub. Date: Sep. 9, 2005

(65) Prior Publication Data

US 2007/0160913 A1 Jul. 12, 2007

(30) Foreign Application Priority Data

Jan. 30, 2004 (FR) .................... 04 00907

(51) Int. Cl.
G03F 1/14 (2006.01)
A61N 5/00 (2006.01)
G03B 27/62 (2006.01)
(52) U.S. Cl. .................... 430/5; 250/492.2; 355/75
(58) Field of Classification Search .............. 430/5; 355/75
See application file for complete search history.

(56) References Cited

U.S. PATENT DOCUMENTS

| 5,474,865 A | 12/1995 | Vasudev | |
|---|---|---|---|
| 5,928,817 A * | 7/1999 | Yan et al. | 430/5 |
| 5,935,733 A * | 8/1999 | Scott et al. | 430/5 |

(Continued)

FOREIGN PATENT DOCUMENTS

WO WO 03/096121 A2 11/2003

OTHER PUBLICATIONS

Maldonado, J.R., et al., Pellicles for X-Ray Lithography Masks, Etec Systems, Inc., SPIE vol. 3331, pp. 245-254, Jun. 1998.

(Continued)

Primary Examiner—Mark F Huff
Assistant Examiner—Jonathan Jelsma
(74) Attorney, Agent, or Firm—Christie, Parker & Hale, LLP

(57) ABSTRACT

A mask (MM) with patterns (MF) for use in a reflection lithography device with a photon beam with a wavelength of less than about 120 nm. Said mask (MM) comprises a planar substrate (ST) fixed to a reflecting structure (SMR) comprising a front face provided with selected patterns (MF) made from a material which is absorbent at the given wavelength and further comprises protection means (SP) which are transparent to the given wavelength and arranged such as to maintain a distance (H) between the perturbing particles (PP) and the patterns (MF) greater than or equal to one of the values of the depth of focus of the lithographic device and the height associated with the percentage of photon absorption by the perturbing particles (PP) which is acceptable.

17 Claims, 2 Drawing Sheets

U.S. PATENT DOCUMENTS

Figure 1:
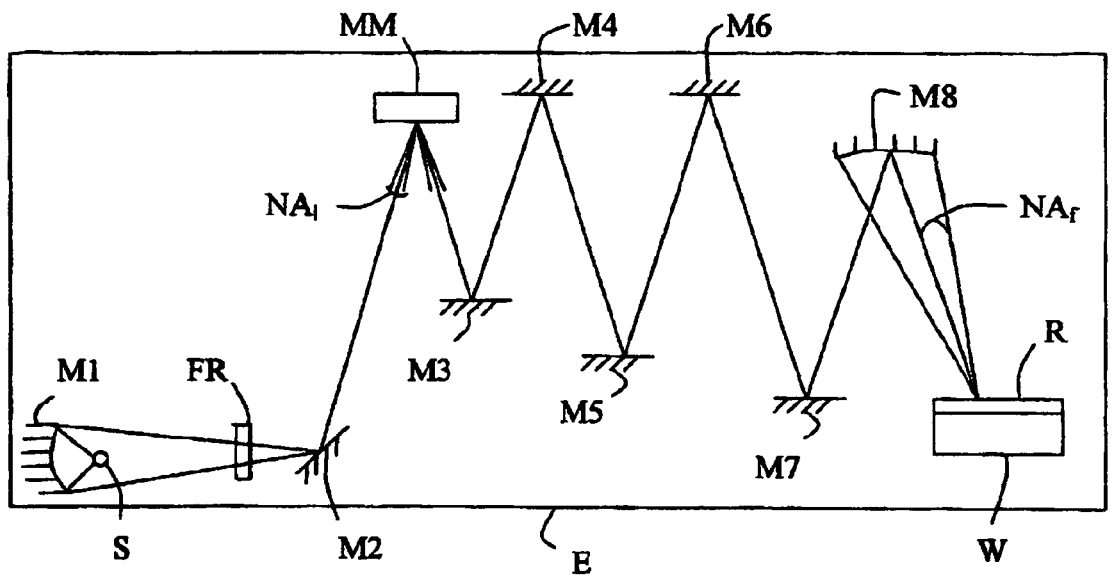

| | | |
|---|---|---|
| 6,280,886 B1 | 8/2001 | Yan |
| 6,492,067 B1 | 12/2002 | Klebanoff et al. |
| 6,623,893 B1 | 9/2003 | Levinson et al. |
| 2002/0012876 A1* | 1/2002 | Angelopoulos et al. .. 430/271.1 |
| 2002/0018941 A1 | 2/2002 | Matsumoto et al. |
| 2003/0186131 A1* | 10/2003 | Enloe ............................ 430/5 |
| 2004/0130693 A1* | 7/2004 | Kurt ............................ 355/67 |
| 2004/0200572 A1* | 10/2004 | Tejnil et al. .............. 156/345.1 |

OTHER PUBLICATIONS

International Search Report, dated Jan. 3, 2006, Corresponding to PCT/FR2005/000168.

* cited by examiner

PROTECTED PATTERN MASK FOR REFLECTION LITHOGRAPHY IN THE EXTREME UV OR SOFT X-RAY RANGE

CROSS-REFERENCE TO RELATED APPLICATION

This application is a National Phase Patent Application of International Application Number PCT/FR2005/000168, filed on Jan. 26, 2005, which claims priority of French Patent Application Number 0400907 filed on Jan. 30, 2004.

The invention relates to the field of patterned masks used in optical lithography.

Optical lithography is a well-known art allowing the reproduction on a resin layer, deposited on a substrate (or "wafer") of patterns present on one of the faces of a mask by means of a beam of photons and an optical projection device, usually operating by reduction.

As the person skilled in the art knows, the resolution of the outlines of patterns formed (or "insolated") in resin is proportional to a critical dimension CD equal to k$\lambda$/NA, where $\lambda$ is the wavelength of the photons of the beam, k is a coefficient less than 1 representing the effect of the devices used to reduce the theoretical limits (such as for example the non-linearity of the resin), and NA is the digital aperture of the beam of photons at the patterns. In other words, the dimensions of the patterns reproduced depend on the wavelength of the photons used.

Due to the properties and advantages offered by electronic components of very small dimensions, in order to realise these, ever smaller wavelengths are being used. Thus the transition has been made from photons having a wavelength in the visible spectrum (436 nm) to photons having a wavelength in the near ultraviolet spectrum (UV) (365 nm or 248 nm), then to photons having a wavelength in the extreme ultraviolet range (193 nm or 157 nm), by using G and I rays of mercury respectively, then lasers with excimers KfF, ArF and $F_2$.

Since masks are difficult and particularly expensive to manufacture without defects, they must therefore be protected in order to avoid "interference" by ambient particles. Such protection is relatively simple to implement when the mask is transparent to photons used for reproducing its patterns. In this case, the mask may in fact be used in transmission, such that it is possible to place a fine protective membrane of transparent, non-interfering material, e.g. polymer, in front of its front face (where the patterns to be reproduced are located) in order that the "interfering" (or unwanted) particles are kept apart from the patterns, thus preventing them from being reproduced on the resin (typically at a distance of 6 mm). This protective membrane (or film) can be cleaned, and in some cases may be replaced after inspection.

When the limits of transparency of the mask are approached, e.g. for a wavelength of 157 nm, the protection of its patterns is more difficult. First, the optical trajectory must be purged with nitrogen ($N_2$) in order to remove gases, such as oxygen ($O_2$), molecules such as water ($H_2O$), and absorbent polymers. Then, a solid protective film must be placed in front of the patterns, being composed of special quartz SiOF or $CaF_2$, which is transparent at 157 nm, having an antireflective treatment, having very parallel faces and a thickness selected such that it forms part of the optical calculation of the image formation of the patterns on the resin.

When the wavelength of the photons is in the extreme ultraviolet (UV) range, or even soft X-ray range (typically between about 120 nm and about 1 nm), the mask is no longer transparent, such that it must be used for reflection. Such a mask is then formed of a planar substrate fixed to a structure which is reflective to the wavelength of the photons being used (realised for example for a wavelength of 13.5 nm (located in the extreme ultraviolet range), in the form of a multilayered structure formed of alternating layers of silicon (Si) and molybdenum (Mo) and having a front face equipped with selected patterns, formed from a material which is absorbent to the said wavelength (e.g. of Cr or TaN).

For this type of mask used in lithography by reflection, there is no known means of protecting the patterns.

The object of the invention is therefore to overcome this disadvantage.

It proposes to this end a patterned mask, for a lithography device operating by reflection of a beam of photons of a wavelength ($\lambda$) less than about 120 nm (and with a selected digital aperture (NA) at the patterns), comprising a planar substrate connected to a reflective structure having a front face equipped with selected patterns formed in a material which is absorbent to the wavelength ($\lambda$).

This mask is characterised in that it comprises protective means transparent to the wavelength and contrived so as to keep interfering particles at a distance (H) from the patterns which is greater than or equal to one of the values taken by the depth of focus (doF) of the lithography device and the height (h) which is associated with the tolerated percentage of absorption of photons by the interfering particles.

For example, the protective means may be contrived such as to keep the interfering particles at a distance (H) from the patterns which is greater than or equal the greater of the values taken by the depth of focus (doF) of the lithography device and the height (h).

This distance (H) is for example between about 50 nm and about 5000 nm. However, it may be greater when a wavelength is used which moves away from the range of soft X-rays.

The protective means of the mask may form a structure having additional features which can be taken separately or in combination, and in particular it is preferable that:

- The structure has a maximum variation of optical thickness selected so as to bring about a local deflection of the beam which is negligible compared to the precision of placing of the patterns,
- The structure does not bring about any phase variation between the photons of the beam which are reflected by the mask,
- The structure is hydrophobic,
- The structure has a front face, opposite to the patterns, which can be cleaned of at least some of the particles which it holds,
- The structure is contrived so as to be capable of inspection, with a selected contrast, by means of observation means operating in the visible or in the ultraviolet (UV) range,
- The structure is capable of thermophoresis,
- The structure is conductive so as to allow the application of an electrostatic effect, e.g. in order to repel the interfering particles,
- The structure is non-diffracting and non-diffusing in the ultraviolet (UV) range.

However, this structure may take different forms, in particular:

- It may be disposed on a front face of the reflective structure and parallel thereto, and have at least one antireflective layer formed from a selected material,
- It may take the form of a foam of a selected material,
- It may be formed from a selected material, be disposed on the front face of the reflecting structure, and define channels allowing its density to be reduced, It may have a membrane connected by pillars to the front face of the reflective structure and in a position substantially parallel to this front face, the thickness of the membrane and the height of the pillars being then selected such that their sum is equal to the selected distance, It may be composed of nanotubes, e.g. oriented in a selected direction relative to the normal to the front face of the reflective structure.

Among the materials which can be selected to form the structure, polymers transparent to the wavelength ($\lambda$, e.g. equal to 10.9 nm or 13.5 nm), carbon (C), carbon nanotubes (or CNT), silicon (Si), beryllium (Be), ruthenium (Ru), silver (Ag), and zirconium (Zr) may be cited.

Figure 2:
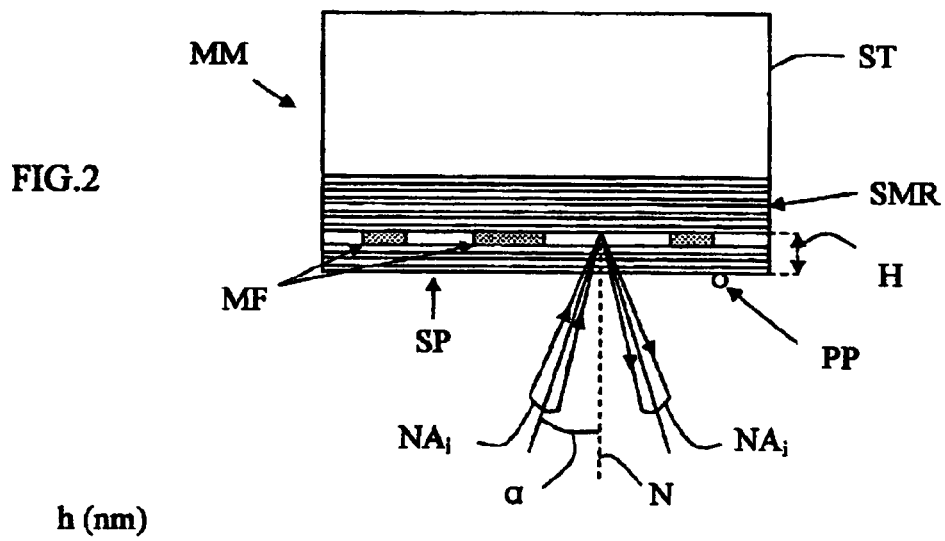
Figure 3:
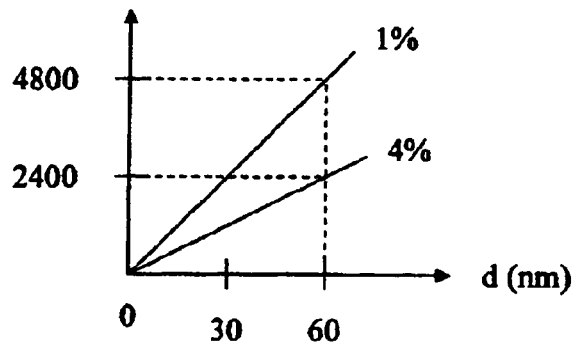

Further features and advantages of the invention will appear from a study of the following detailed description, and from the attached drawings in which:

FIG. 1 shows schematically an embodiment of a device for lithography by reflection in the extreme ultraviolet (EUV) range, FIG. 2 shows schematically, in a transverse section view, a first embodiment of a patterned mask according to the invention, FIG. 3 is a diagram showing the evolution of the parameter h according to the diameter d of the interfering particles, for two different values of absorption of photons (1% and 40%).

Figure 4:
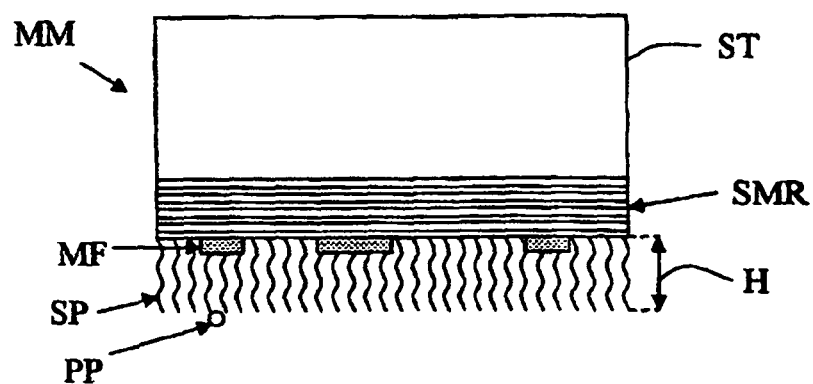
Figure 5:
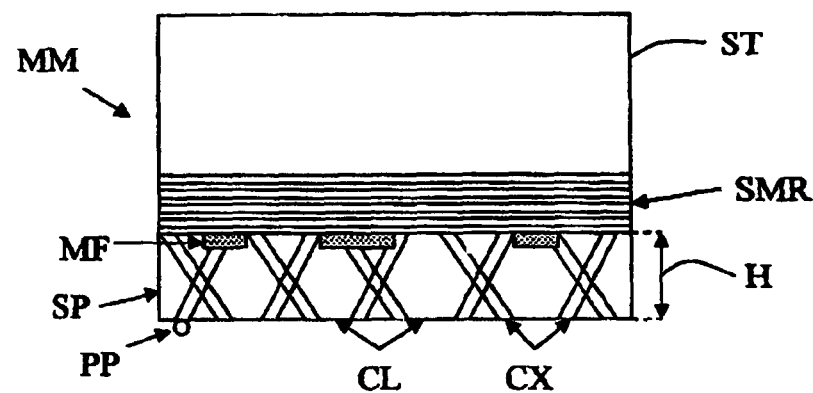
Figure 6:
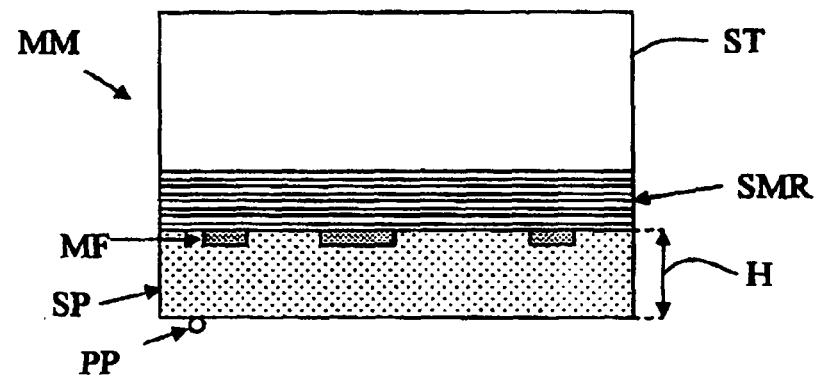
Figure 7:
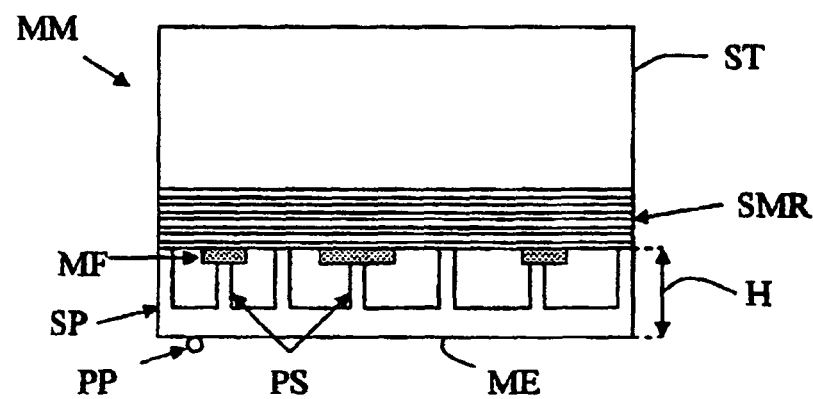

FIG. 4 shows schematically in a transverse section view a second embodiment of a patterned mask according to the invention, FIG. 5 shows schematically in a transverse section view a third embodiment of a patterned mask according to the invention, FIG. 6 shows schematically in a transverse section view a fourth embodiment of a patterned mask according to the invention, FIG. 7 shows schematically in a transverse section view a fifth embodiment of a patterned mask according to the invention.

The attached drawings may serve not only to complement the invention, but also to contribute to its definition if need be.

The invention relates to a patterned mask intended to be used in a device for lithography by reflection operating with a source of photons whose wavelength ($\lambda$) is less than about 120 nm, i.e. which belongs to the extreme ultraviolet (EUV) range and to the range of soft X-rays, in particular 10.9 nm and 13.6 nm.

We refer first to FIG. 1 to describe an embodiment, very schematically, of a device for lithography by reflection using a patterned mask MM according to the invention.

A lithography device chiefly comprises an optical image-forming device M3-M8 (also known as projection device) and a source S of photons, coupled to collecting mirrors M1 and M2, installed in an ultrahigh vacuum enclosure E, in which are defined, very precisely, a positioning zone of a patterned mask MM and a positioning zone of a "wafer" W.

The patterned mask MM is intended to act reflectively. It will be described in more detail below.

The wafer W is generally formed of a planar substrate equipped on one of its faces with a layer of resin R sensitive to the photons delivered by the source S of the lithography device.

The source S is for example responsible for delivering photons whose wavelength $\lambda$ is equal to 13.5 nm. Such a wavelength is for example obtained with a discharge or plasma laser source in xenon (Xe) or tin (Sn). However, obviously, it could deliver photons having other wavelengths between about 120 nm and about 1 nm, and in particular a wavelength equal to 10.9 nm (which corresponds to another range of emission of xenon (Xe).

In the example shown, the mirrors M1 and M2 and the filter FR are responsible for the collimation of the photons delivered by the source S, so that they reach the front face of the mask MM (which has the patterns MF (see FIG. 2)) in the form of a beam having a selected digital aperture $NA_i$. For example, $NA_i$ is equal to 0.064, which corresponds to an angle of aperture on the patterns of ±3.6°.

However, the optical image-forming device M3-M8 (also known as optical projection device) is responsible for forming the image of the patterns MF of the mask MM on the resin R of the wafer W, with a selected factor of reduction, e.g. equal to about 4. It is formed here of six mirrors M3 to M8, by way of example.

The angles of incidence of the beam of photons on the different mirrors and the respective positions of the different mirrors are selected so as to allow a factor of reduction to be obtained as well as an illumination of the layer of resin R under a selected digital aperture $NA_f$, e.g. equal to about 0.25.

The angle of incidence $\alpha$ of the beam of photons relative to the normal N to the front face of the patterned mask MM (see FIG. 2) is generally equal to a few degrees, e.g. about 6°.

Obviously, this is only a very schematic illustrative example. Numerous other combinations of optical means can be conceived to effect collimation and image formation.

We refer now more particularly to FIG. 2 in order to describe a first embodiment of the patterned mask MM according to the invention. In this Figure, as in FIGS. 4 to 7, the relative dimensions of the different elements are not representative of their real relative dimensions.

A patterned mask MM, used reflectively, first of all has a planar substrate ST, one face of which is connected to a structure SMR reflective to the wavelength $\lambda$ of the photons from the source S and comprising a front face equipped with selective patterns MF formed from a material absorbent to the wavelength $\lambda$.

For example, the reflective structure SMR is a multilayered structure formed of a stack of 40 pairs of layers of silicon (Si), e.g. 4 nm thick, and of molybdenum (Mo), e.g. 2.7 nm thick. Buffer layers and protective layers can be added for technological reasons.

The absorbent patterns are for example formed from chromium (Cr) or TaN. However, any other material absorbent to the wavelength $\lambda$ of the photons (here equal to 13.5 nm) is conceivable. The thickness of the patterns MF is preferably reduced so as to avoid the edge effects of the masks whose dimensions are typically of the order of 152 mm×152 mm (for a zone of 104 mm×104 mm reserved for the patterns MF). However, taking into account a reduction factor of about 4, the lines printed in the layer of resin R have for example a width of 25 nm, 32 nm or 45 nm, which corresponds to patterns MF whose widths are respectively 100 nm, 128 nm and 180 nm.

As the person skilled in the art knows, and as referred to in the introduction, numerous interfering particles PP of very small dimensions (e.g. 30 to 60 nm) are capable of infiltrating between the absorbent parts forming the patterns MF, thus impairing the integrity of the mask MM. The interfering particles PP do not tangibly obstruct either the image formation nor absorption when they are located on the absorbent parts.

In order to prevent such infiltration from arising, the invention proposes to place in front of the patterns MF protective means SP transparent to the wavelength $\lambda$ of the photons and having the task of keeping the interfering particles PP at a distance H from the patterns, which is greater than or equal to one of the values taken by the depth of focus doF of the lithography device and the height h associated with the tolerated percentage of absorption of the photons by the interfering particles PP.

The depth of focus doF is equal to $\lambda/NA_i^2$ For example, in the case of a digital aperture $NA_i$ equal to 0.064 and a wavelength $\lambda$ equal to 13.5 nm, a depth of focus doF equal to about 3296 nm is obtained. Obviously, this is only an example, and doF may vary typically between about 50 nm and about 5000 nm according to the selected values for $NA_i$ and $\lambda$, or even more when a wavelength is being used which is moving away from the range of soft X-rays.

Furthermore, it should be borne in mind that the percentage of absorption of photons by the interfering particles PP is defined by the factor (or percentage) of shade which is given by the formula:

$$\text{Percentage of shade} = \left(\frac{d}{h^*2NA_i}\right)^2$$

where d is the diameter of the interfering particles PP, and h is the parameter representing the height separating the interfering particles from the patterns MF.

If an absorption of photons equal to about 1% is tolerated, the simplified relation h=80*d is obtained. On the other hand, if an absorption of photons equal to about 4% is tolerated, the simplified relation h=40*d is obtained. The diagram of FIG. 3 shows the evolution of the parameter h (in nanometers (nm)) as a function of diameter d (in nanometers (nm)) of the interfering particles for photon absorption values equal to 1% (upper curve) and 4% (lower curve).

The smaller the diameter d of the interfering particle PP, the less the parameter h occurs in the choice of distance H separating the front part of the protective means SP from the front face of the reflective structure SMR (where the patterns MF are formed). The value of H must therefore be selected to be greater than or equal to one of the values taken by doF and h.

For example, in the first order, the following conditions can be fixed: if doF is greater than h, the distance H must be greater than or equal to doF, whereas if doF is less than h, the distance H must be greater than or equal to h. In other words, in the first order, the value of H is selected greater than or equal to the greatest of the values taken by doF and h. Simulation calculations of image formation taking into account the additional parameters, such as for example diffraction and/or the differences in index, make it possible to refine the above-mentioned conditions.

The protection means SP can further have one or more additional features which may reinforce the performance and/or advantages.

It is for example advantageous that the protective means SP absorb very few, if any, photons. It should be borne in mind particularly that in reflection lithography, the optical thickness T of the protective means SP is traversed twice. To this end, it is preferable to use a material with low, i.e. very low, ageing, resistant to the beam of photons and having low, i.e. very low oxidation.

It will be noted that an interfering particle PP can be traversed twice, but not by the same beam.

It is for example also advantageous that the protective means SP have a maximum variation of optical thickness T which brings about local deflection of the beam of photons which is negligible in relation to the precision of placing of the patterns MF.

It is for example advantageous that the protective means SP do not bring about (or hardly bring about) any phase variation between the photons of the beam which are reflected by the mask MM.

It is for example advantageous that the protective means SP are hydrophobic. It is to be borne in mind that water molecules ($H_2O$) are absorbent to 13.5 nm.

It is also advantageous for example that the front face of the protective means SP, which is opposite to the patterns MF, can be cleaned of at least some of the interfering particles PP which it holds. In this case, it is preferable that the protective means SP can be inspected, with a selected contrast, by observation means operating in the visible or ultraviolet range, e.g. at 248 nm.

Instead of cleaning the front face of the protective means SP, it is conceivable to remove them from the mask MM in order to replace them. This removal can be effected for example by combustion or oxidation (particularly if they are formed from a base of carbon nanotubes, as will be seen below) by means of carbon dioxide ($CO_2$, which is then evaporated and pumped in order to avoid residual deposits. Once this removal has been carried out, the mask MM can be inspected, then new protective means SP can be placed on the front face.

It is for example also advantageous that the protective means SP are capable of thermophoresis.

It is for example also advantageous that the protective means SP are electrically conductive in order to be used to apply an electrostatic effect, e.g. in order to repel the interfering particles when they are ionised.

It is for example also advantageous that the protective means SP are non-diffracting and non-diffusing in ultraviolet (UV), including in extreme ultraviolet, for the quality of the image, in particular when the wavelength is equal to 13.5 nm, and for the quality and contrast upon inspection.

Numerous structures may constitute the protective means SP indicated above. These structures must always be fixed to the substrate ST or to the reflective structure SMR and may comprise a part for keeping at a distance the interfering particles PP, also known as a film (or membrane), which is either remote from the patterns MF or in contact therewith.

As is shown schematically in FIG. 1, the protective means SP may consist in a planar antireflective structure, preferably of the multilayered type, placed on the front face of the reflective structure SMR and parallel thereto. To this end, Mo—Si layers may be used for example.

In a first modification, shown in FIG. 4, the protective means SP may form a structure composed of nanotubes oriented in a selected direction relative to the normal N to the front face of the reflective structure SMR. For example, carbon nanotubes (CNT) may be used, preferably having walls of a monoatomic thickness, spaced apart by a distance less than the diameter of the smallest interfering particles PP, and being capable if necessary of having a disorientation relative to the normal N.

In a second modification, shown in FIG. 5, the protective means SP may form a structure having layers CL in which are defined channels CX of dimensions adapted relative to those of the interfering particles PP, with a view to blocking these at their front ends. Since these channels CX are filled with a "vacuum", they make it possible to reduce the density of the material. Such a structure may be defined by means of a lithography technology applied to a material such as silicon (Si) or a polymer, such as for example PMMA. It may also be obtained by adding to the front face of the reflective structure SMR a photonic crystal or porous silicon.

In a third modification, shown in FIG. 6, the protective means SP may form a foam structure forming a membrane (or film), preferably connected to the front face of the reflective structure SMR. As in the second modification, the foam contains numerous empty spaces which make it possible to reduce the density of the material. This foam may be for example formed from a polymer, such as PMMA, or of nanotubes, e.g. of carbon (or CNT), or of beryllium (Be), ruthenium (Ru), silver (Ag) or even zirconium (Zr).

In a fourth modification shown in FIG. 7, the protective means SP may form a structure formed by a membrane (or film) ME connected by pillars PS to the front face of the reflective structure SMR. Some ends of pillar PS may bear on the patterns MF, as is shown. The membrane ME is placed substantially parallel to the front face of the reflective structure SMR. However, the thickness of the membrane ME and the height of the pillars PS are selected such that their sum is equal to the selected distance H. The pillars may be obtained for example by growing seeds. Such a structure may be realised for example from a polymer, such as PMMA, or from silicon (Si), or even from an antireflective material such as Mo—Si. The material forming this structure may also be present in the form of a foam, as in the third modification indicated above with reference to FIG. 6.

The invention is not limited to the embodiments of a patterned mask described above solely by way of example, but also embraces all the modifications which the person skilled in the art may conceive within the scope of the claims below.

The invention claimed is:

1. Mask (MM) having patterns (MF), for a lithography device operating by reflection of a beam of photons of a wavelength less than about 120 nm, comprising a planar substrate (ST) connected to a reflective structure (SMR) comprising a front face equipped with selected patterns (MF), formed from a material absorbent to the said wavelength, characterised in that it comprises protective means (SP) contacting the reflective structure (SMR) and transparent to the said wavelength and contrived to keep interfering particles (PP) at a distance (H) from the patterns (MF) which is greater than or equal to one of two values taken from a depth of focus (doF) of the device and a height of pattern/interfering particle (h) associated with a tolerated percentage of absorption of photons by the interfering particles (PP) which is a function of their diameter (d), and characterised in that the protective means (SP) form a structure having a membrane (ME) connected by pillars (PS) to the front face of the reflective structure, and in a position substantially parallel to the front face, the thickness of the membrane (ME) and the height of the pillars (PS) being such that their sum is equal to the selected distance (H), the pillars (PS) contacting at least one of the patterns (MF).

2. Mask according to claim 1, characterised in that the protective means (SP) are contrived to keep the interfering particles (PP) at a distance (H) from the patterns (MF) which is greater than or equal to the two values taken by the depth of focus (doF) of the device and the height of pattern/interfering particle (h).

3. Mask according to either of claim 1 or 2, characterised in that the protective means (SP) form a structure having a maximum variation of optical thickness selected so as to bring about locally a deflection of the beam which is negligible compared to the precision of placing of the patterns (MF).

4. Mask according to claim 1, characterised in that the protective means (SP) form a structure which brings about substantially no phase variation between photons of the beam reflected by the mask.

5. Mask according to claim 1, characterised in that the protective means (SP) form a hydrophobic structure.

6. Mask according to claim 1, characterised in that the protective means (SP) form a structure of which at least a front face, opposite to the patterns (MF), is capable of being cleaned of some at least of the interfering particles (PP) which it holds.

7. Mask according to claim 1, characterised in that the protective means (SP) form a structure capable of being inspected, with a selected contrast, by means of observation means operating in the visible or ultraviolet range.

8. Mask according to claim 1, characterised in that the protective means (SP) form a conductive structure capable of thermophoresis.

9. Mask according to claim 1, characterised in that the protective means (SP) form a conductive structure capable of applying an electrostatic effect.

10. Mask according to claim 9, characterised in that the electrostatic effect is intended to repel the interfering particles (PP).

11. Mask according to claim 1, characterised in that the protective means (SP) form a structure which is non-diffracting and non-diffusing in the ultraviolet range.

12. Mask according to claim 1, characterised in that the distance (H) is between about 50 nm and about 5000 nm.

13. Mask according to claim 1, characterised in that the protective means (SP) form a structure placed on the front face of the reflective structure and parallel thereto, and comprising at least one antireflective layer.

14. Mask according to claim 1, characterised in that the protective means (SP) form a structure composed of a foam.

15. Mask (MM) having patterns (MF), for a lithography device operating by reflection of a beam of photons of a wavelength less than about 120 nm, comprising a planar substrate (ST) connected to a reflective structure (SMR) comprising a front face equipped with selected patterns (MF), formed from a material absorbent to the said wavelength, characterised in that it comprises protective means (SP) contacting the reflective structure (SMR) and transparent to the said wavelength and contrived to keep interfering particles (PP) at a distance (H) from the patterns (MF) which is greater than or equal to one of two values taken from a depth of focus (doF) of the device and a height of pattern/interfering particle (h) associated with a tolerated percentage of absorption of photons by the interfering particles (PP) which is a function of their diameter (d), and characterised in that the protective means (SP) form a structure formed from a material, placed on the front face of the reflective structure (SMR) and defining channels (CX) making it possible to reduce the density of the material, at least one of the patterns (MF) being accessible to the channels.

16. Mask (MM) having patterns (MF), for a lithography device operating by reflection of a beam of photons of a wavelength less than about 120 nm, comprising a planar substrate (ST) connected to a reflective structure (SMR) comprising a front face equipped with selected patterns (MF), formed from a material absorbent to the said wavelength, characterised in that it comprises protective means (SP) contacting the reflective structure (SMR) and transparent to the said wavelength and contrived to keep interfering particles (PP) at a distance (H) from the patterns (MF) which is greater than or equal to one of two values taken from a depth of focus (doF) of the device and a height of pattern/interfering particle (h) associated with a tolerated percentage of absorption of photons by the interfering particles (PP) which is a function of their diameter (d), and characterised in that the protective means (PS) form a structure composed of nanotubes oriented to extend along a selected direction substantially normal (N) to the front face of the reflective structure (SMR), the nanotubes contacting at least one of the patterns (MF).

17. Mask according to claim 13, characterised in that the at least one antireflective layer is composed of a material selected from at least polymers transparent to the said wavelength, carbon, carbon nanotubes, silicon, beryllium, ruthenium, silver or zirconium.

* * * * *